United States Patent
Huang et al.

(10) Patent No.: US 12,425,009 B2
(45) Date of Patent: Sep. 23, 2025

(54) METHOD AND DEVICE FOR OUTPUTTING FREQUENCY MULTIPLICATION SIGNAL HAVING HIGH HARMONIC SUPPRESSION, AND STORAGE MEDIUM

(71) Applicant: SANECHIPS TECHNOLOGY CO., LTD., Guangdong (CN)

(72) Inventors: Bei Huang, Guangdong (CN); Zhilin Chen, Guangdong (CN)

(73) Assignee: SANECHIPS TECHNOLOGY CO., LTD., Guangdong (CN)

( * ) Notice: Subject to any disclaimer, the term of this patent is extended or adjusted under 35 U.S.C. 154(b) by 211 days.

(21) Appl. No.: 18/037,977

(22) PCT Filed: Oct. 20, 2021

(86) PCT No.: PCT/CN2021/125001
§ 371 (c)(1),
(2) Date: May 19, 2023

(87) PCT Pub. No.: WO2022/105520
PCT Pub. Date: May 27, 2022

(65) Prior Publication Data
US 2023/0412158 A1     Dec. 21, 2023

(30) Foreign Application Priority Data
Nov. 19, 2020   (CN) .......................... 202011308481.4

(51) Int. Cl.
*H03K 5/1252* (2006.01)
*H03K 5/00* (2006.01)

(52) U.S. Cl.
CPC ....... *H03K 5/1252* (2013.01); *H03K 5/00006* (2013.01)

(58) Field of Classification Search
CPC .... H03K 5/1252; H03K 5/00006; H03B 1/04; H03B 19/14
See application file for complete search history.

(56) References Cited

U.S. PATENT DOCUMENTS

| | | | |
|---|---|---|---|
| 6,388,546 B1 | 5/2002 | Kiyokawa et al. | |
| 2006/0055442 A1* | 3/2006 | Tanaka | H03L 7/0812 327/231 |

FOREIGN PATENT DOCUMENTS

| | | |
|---|---|---|
| CN | 102570983 A | 7/2012 |
| CN | 103219945 A | 7/2013 |

(Continued)

OTHER PUBLICATIONS

Korea Patent Office, KR10-2023-7019538 1st Preliminary Rejection issued on Jan. 22, 2025.

(Continued)

*Primary Examiner* — Metasebia T Retebo
(74) *Attorney, Agent, or Firm* — Li & Cai Intellectual Property (USA) Office (57) ABSTRACT

A method and device for outputting frequency multiplication signal having high harmonic suppression, and a storage medium. The method includes: obtaining initial signal; inputting the initial signal into target circuit, where the target circuit includes parallel circuit, first circuit of the parallel circuit is provided with frequency multiplier, second circuit of the parallel circuit is provided with phase adjustment module, the first circuit is connected to input end and output ends of the target circuit, the second circuit is disconnected from the input end and the output end, the phase adjustment module is configured to adjust a phase of the second circuit to a target phase, and phase difference between the target phase and a first phase of the first circuit is greater than 90

(Continued)

degrees; taking a target signal output from the target circuit as frequency multiplication signal of the initial signal.

12 Claims, 4 Drawing Sheets

(56) References Cited

FOREIGN PATENT DOCUMENTS

| | | | | |
|---|---|---|---|---|
| CN | 208285282 U | | 12/2018 | |
| CN | 111711461 A | * | 9/2020 | ............... H04B 1/08 |
| JP | 2015170883 A | | 9/2015 | |
| KR | 10-2020-0065322 A | | 6/2020 | |
| KR | 20200065322 A | * | 6/2020 | |

OTHER PUBLICATIONS

European Patnent Office, EP21893668.0 Extended Search Report issued on Sep. 25, 2024.
China Patent Office, the first Office action of CN application No. 202011308481.4 issued on May 23, 2025.

* cited by examiner

METHOD AND DEVICE FOR OUTPUTTING FREQUENCY MULTIPLICATION SIGNAL HAVING HIGH HARMONIC SUPPRESSION, AND STORAGE MEDIUM

The disclosure claims the priority of Chinese patent application No. 202011308481.4 titled "METHOD AND DEVICE FOR OUTPUTTING FREQUENCY MULTIPLICATION SIGNAL HAVING HIGH HARMONIC SUPPRESSION, and STORAGE MEDIUM" filed with the China National Intellectual Property Administration on Nov. 19, 2020, the disclosure of which is incorporated herein by reference in its entirety.

TECHNICAL FIELD

Embodiments of the present disclosure relate to the field of communications, and in particular, to a method and device for outputting a frequency multiplication signal having high harmonic suppression, and a storage medium.

BACKGROUND

In the related art, if, for example, a frequency-doubled signal is desired while outputting a frequency multiplication signal, an initial signal is directly input into a frequency doubler, from which a frequency doubled signal is output. However, in this process, the frequency doubler may also output the initial signal, a frequency tripled signal, a frequency quadrupled signal, and the like, resulting in a low harmonic suppression ratio of the output frequency multiplication signal.

SUMMARY

Embodiments of the present disclosure provide a method and device for outputting a frequency multiplication signal having high harmonic suppression, and a storage medium which can solve at least the problem of low harmonic suppression ratio of the output frequency multiplication signal in the related art.

According to an embodiment of the present disclosure, there is provided a method for outputting a frequency multiplication signal, including: obtaining an initial signal; inputting the initial signal into a target circuit, wherein the target circuit includes a parallel circuit, a first circuit of the parallel circuit is provided with a frequency multiplier, a second circuit of the parallel circuit is provided with a phase adjustment module, the first circuit is connected to an input end and an output end of the target circuit, the second circuit is disconnected from the input end and the output end, the phase adjustment module is configured to adjust a phase of the second circuit to a target phase, and a phase difference between the target phase and a first phase of the first circuit is more than 90 degrees; and taking a target signal output from the target circuit as a frequency multiplication signal of the initial signal.

According to another embodiment of the present disclosure, there is provided a device for outputting a frequency multiplication signal, including: a target circuit including a parallel circuit, wherein a first circuit of the parallel circuit is provided with a frequency multiplier, a second circuit of the parallel circuit is provided with a phase adjustment module, the first circuit is connected to an input end and an output end of the target circuit, the second circuit is disconnected from the input end and the output end, the phase adjustment module is configured to adjust a phase of the second circuit to a target phase, a phase difference between the target phase and a first phase of the first circuit is more than 90 degrees, and the target circuit is configured to multiply an input initial signal to a frequency multiplication signal of the initial signal.

According to yet another embodiment of the present disclosure, there is further provided a computer-readable storage medium having a computer program stored thereon, wherein the computer program is configured to, when executed, cause operations of any one of the above method embodiments to be implemented.

According to still yet another embodiment of the present disclosure, there is further provided an electronic apparatus, including a memory and a processor, wherein the memory has a computer program stored thereon, and the processor is configured to execute the computer program to implement operations of any one of the method embodiments as described above.

According to the present disclosure, due to provision of the phase adjustment module, the phase of the second circuit is adjusted to a phase more than 90 degrees away from the phase of the first circuit, the phase adjustment module is disconnected in the second circuit, and the frequency multiplier is connected in the first circuit, so that the phase adjustment module can counteract interference signals output from the frequency multiplier in the first circuit, and a purer frequency multiplication signal can be obtained. Therefore, the problem of low harmonic suppression ratio of the output frequency multiplication signal can be solved, and the effect of improving the spectral purity of the output frequency multiplication signal is achieved.

DETAIL DESCRIPTION OF EMBODIMENTS

Embodiments of the present disclosure will be described in detail below with reference to the drawings in conjunction with the embodiments.

It should be noted that the terms "first", "second", and the like in the description, claims and drawings of the present disclosure are used for the purpose of distinguishing similar objects instead of indicating a specific order or sequence.

Figure 1:
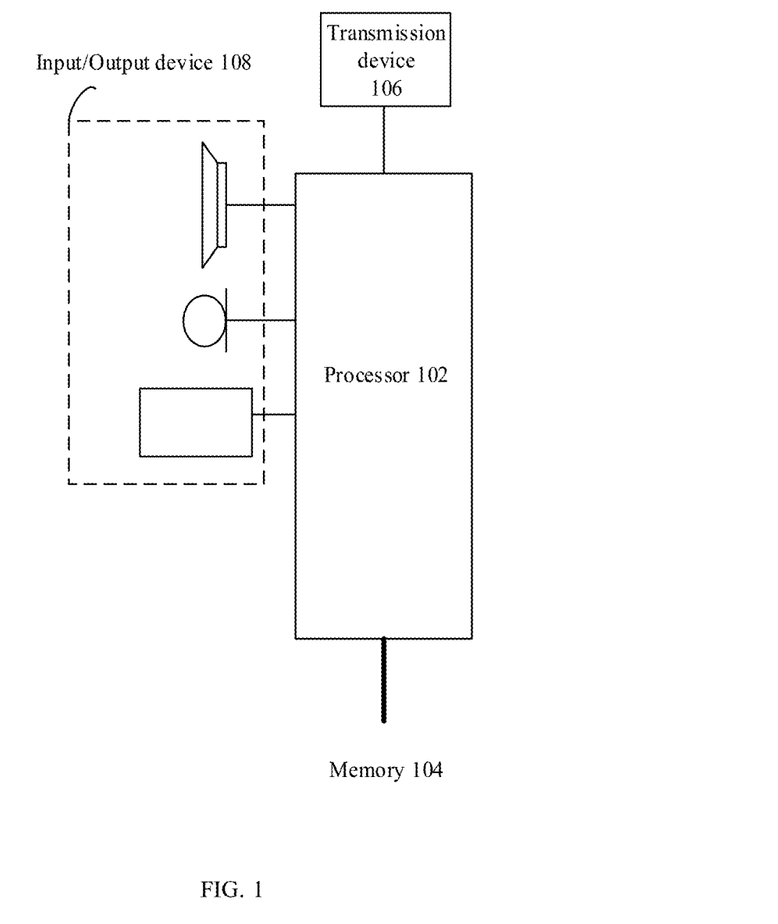
FIG. 1 is a hardware configuration diagram illustrating a method for outputting a frequency multiplication signal according to an embodiment of the present disclosure.

The process embodiment provided in the embodiments of the present disclosure may be implemented in a mobile terminal, a computer terminal or any other computing apparatus. Taking running on a mobile terminal as an example, FIG. 1 is a hardware configuration diagram illustrating a mobile terminal used in a method for outputting a frequency multiplication signal according to an embodiment of the present disclosure. As shown in FIG. 1, the mobile terminal may include one or more processors 102 (merely one processor is shown in FIG. 1) (the processor 102 may include, but is not limited to, a microprocessor (MCU) or a processing device of a programmable logic device such as FPGA) and a memory 104 configured to store data. The mobile terminal may further include a transmission device 106 for communication functions and an input/output device 108. It will be understood by those ordinary skilled in the art that the structure shown in FIG. 1 is merely illustrative, and does not form any limitation to the structure of the above mobile terminal. For example, the mobile terminal may include more or fewer components than those shown in FIG. 1, or have a different configuration than that shown in FIG. 1.

The memory 104 may be configured to store a computer program, for example, an application software program or a module, such as a computer program corresponding to the method for outputting a frequency multiplication signal according to an embodiment of the present disclosure. The processor 102 executes the computer program stored in the memory 104 to perform various functional applications and data processing, that is, implement the above method. The memory 104 may include a high speed random access memory, and may also include a non-volatile memory such as at least one magnetic storage device, flash memory, or other non-volatile solid state memory. In some examples, the memory 104 may further include a memory remotely located relative to the processor 102, which may be connected to the mobile terminal over a network. Examples of such networks include, but are not limited to, the Internet, intranets, local area networks, mobile communication networks, and combinations thereof.

The transmission device 106 is configured to receive or transmit data via a network. Specific examples of such networks may include a wireless network provided by a communication provider of the mobile terminal. In an example, the transmission device 106 includes a Network Interface Controller (NIC) that may be connected to another network device through a base station to communicate with the Internet. In an example, the transmission device 106 may be a Radio Frequency (RF) module configured to communicate with the Internet wirelessly.

Figure 2:
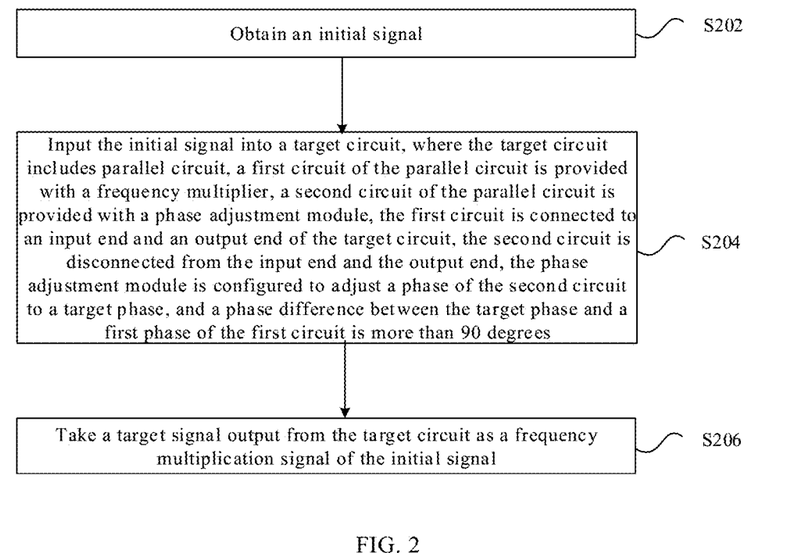
FIG. 2 is a flowchart illustrating a method for outputting a frequency multiplication signal according to an embodiment of the present disclosure.

Optionally, as shown in FIG. 2, the method for outputting a frequency multiplication signal includes the following operations 5202 to 5206.

At 5202, obtaining an initial signal.

At 5204, inputting the initial signal into a target circuit, wherein the target circuit includes a parallel circuit, a first circuit of the parallel circuit is provided with a frequency multiplier, a second circuit of the parallel circuit is provided with a phase adjustment module, the first circuit is connected to an input end and an output end of the target circuit, the second circuit is disconnected from the input end and the output end, the phase adjustment module is configured to adjust a phase of the second circuit to a target phase, and a phase difference between the target phase and a first phase of the first circuit is more than 90 degrees.

At 5206, taking a target signal output from the target circuit as a frequency multiplication signal of the initial signal.

Optionally, the method for outputting a frequency multiplication signal described above may be applied in, but not limited to, frequency multiplication of an initial signal. Multiple of the frequency multiplier depends on the desired multiple of the frequency signal. If a frequency doubled signal is desired, a frequency doubler and the phase adjustment module may be connected in parallel, and the phase adjustment module remains disconnected from the circuit. Then the phase adjustment module is connected to the circuit, and the phase adjustment module adjusts a phase of the second circuit where the phase adjustment module is located to a target phase which differs from a phase of the first circuit where the frequency doubler is located by more than 90 degrees. At this time, a phase difference between the first circuit and the second circuit is more than 90 degrees, and the second circuit where the phase adjustment module is located can generate a signal opposite to that of the first circuit, so as to counteract interference signals generated by the frequency multiplier in the second circuit during frequency multiplication, thereby obtaining a purer frequency multiplication signal and improving the spectral purity of the output frequency multiplication signal.

Optionally, the phase adjustment module is further configured to set a difference between a harmonic amplitude of the second circuit and a harmonic amplitude of the first circuit to be less than a first threshold.

If the difference between the harmonic amplitudes of the two circuits is small, interference signals of the first circuit can be ensured to be counteracted by signals of the second circuit as many as possible, and the harmonic suppression ratio of the output frequency multiplication signal can be improved. It should be noted that by setting the difference between the harmonic amplitude of the second circuit and the harmonic amplitude of the first circuit to be less than the first threshold, it actually means that the difference between the harmonic amplitude of the second circuit and the harmonic amplitude of the first circuit is set to be less than the first threshold under a combined action of the phase adjustment module and an open switch.

Optionally, the phase difference between the target phase and the first phase is 180 degrees. If the second circuit is 180 degrees out of phase with the first circuit, it indicates that the phases are completely opposite, and interference signals of the first circuit can be counteracted as many as possible.

Optionally, the phase adjustment module is a phase shifter or an inverter or an amplifier. In other words, the phase adjustment module in the embodiment of the present application is any device, circuit or module/unit capable of adjusting a phase, which is not limited in the embodiments of the present disclosure.

The first circuit is connected to the input end and the output end through a single-pole double-throw switch. Optionally, if the single-pole double-throw switch is connected to the first circuit of the target circuit, the initial signal may be processed through the frequency multiplier in the first circuit to obtain a frequency multiplication signal, and in the process, the second circuit is disconnected, and the phase adjustment module in the second circuit can counteract part of the interference signals. If the single-pole double-throw switch is connected to the second circuit of the target circuit, the initial signal may be processed through the second circuit to obtain the initial signal, and in this process, the first circuit can counteract part of the interference signals to achieve the effect of filtering the output initial signal.

Optionally, the frequency multiplier is a first frequency doubler, a second frequency doubler is connected after the output end, and taking the target signal output from the target circuit as the frequency multiplication signal of the initial signal includes:

under the condition that the first circuit is connected to the input end and the output end of the target circuit while the second circuit is disconnected from the input end and the output end, processing the initial signal through the first frequency doubler and the second frequency doubler to output a frequency quadrupled signal; and under the condition that the first circuit is disconnected from the input end and the output end of the target circuit while the second circuit is connected to the input end and the output end, processing the initial signal through the phase adjustment module and the second frequency doubler to output a frequency doubled signal.

According to this embodiment, the effect of improving the harmonic suppression ratio of the output frequency multiplication signal can be achieved in the process of obtaining the frequency multiplication signal of the output initial signal.

The above method for outputting a frequency multiplication signal will be explained below with reference to a specific example.

Figure 3:
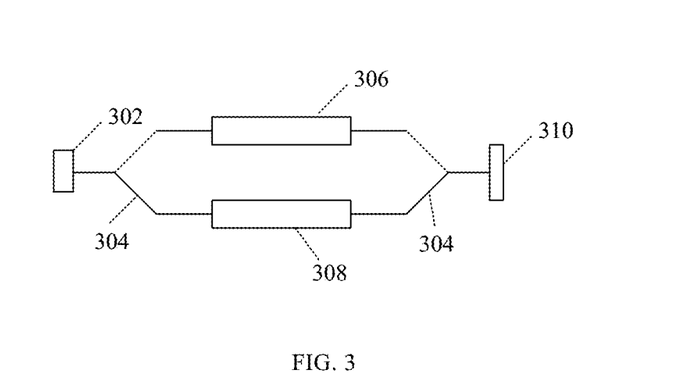
FIG. 3 is a schematic diagram illustrating a system architecture illustrating a method for outputting a frequency multiplication signal according to an embodiment of the present disclosure.

An embodiment of the present application relates to harmonic suppression of a frequency multiplier in a local oscillation link. An embodiment of the present application provides a target circuit. As shown in the system block diagram of the circuit in FIG. 3, the target circuit includes: a single-pole double-throw switch 304, a phase adjustment module 306, and a frequency multiplier 308. The single-pole double-throw switch is connected to the frequency multiplier 308, and the phase adjustment module 306 is disconnected. A fundamental harmonic (initial signal) is input from an input end 302, passes through the frequency multiplier 308, and then is output from an output end (the frequency multiplier 308 is a frequency doubler).

Figure 4:
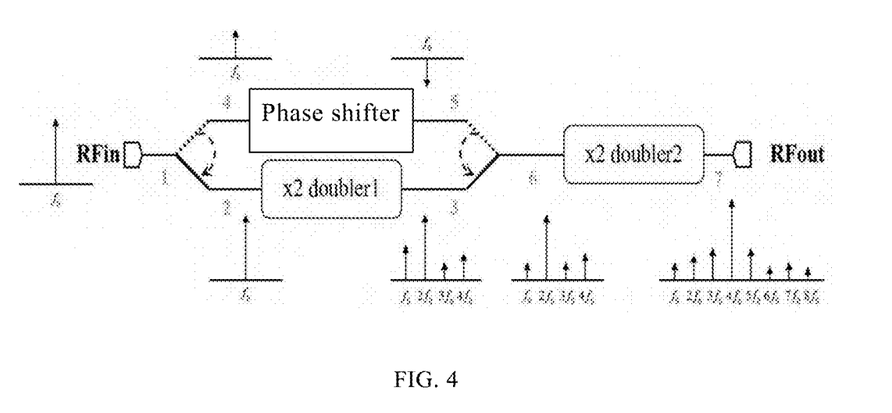
FIG. 4 is a schematic diagram illustrating a system architecture of a method for outputting a frequency multiplication signal according to an embodiment of the present disclosure.

As an optional example, the parallel circuit in the target circuit in the embodiment of the present application is connected to a frequency doubler, as shown in FIG. 4. In FIG. 4, $f_0$ is the fundamental harmonic, the phase shifter is the phase adjustment module, RFin is a fundamental harmonic input end, RFout is a fundamental harmonic output end, and x2 doubler1 and x2 doubler2 are frequency doublers. Each arrow indicates the signal intensity and has a direction.

When the system in FIG. 4 is operated in an x2 mode, the single-pole double-throw switch is turned on at positions of the dotted lines, and turned off at positions of the solid lines, and a signal is cascaded through the phase shifter in the first-stage parallel branches and the second-stage frequency multiplier. When the system is operated in an x4 mode, the single-pole double-throw switch is turned on at positions of the solid lines, and turned off at positions of the dotted lines, and a signal is cascaded through the first-stage frequency multiplier and the second-stage frequency multiplier. The x2 mode refers to a mode of inputting a fundamental harmonic and outputting a second harmonic, and the x4 mode refers to a mode of inputting a fundamental harmonic and outputting a fourth harmonic.

Compared with traditional double and quadruple frequency multiplexing systems, the improved scheme proposed in the embodiment of the present application does not increase occupation of the hardware area, and can improve the integral harmonic suppression ratio.

The novel x2 frequency multiplier and x4 frequency multiplier multiplexing system includes two single-pole double-throw switches, two stages of frequency multipliers and one phase shifter. The two single-pole double-throw switches control to select different paths of the first stage under different scenes. The frequency multiplier x2 doubler1 realizes frequency multiplication of the input signal from $f_0$ to $2f_0$, and the frequency multiplier x2 doubler2 realizes frequency multiplication of the input signal from $2f_0$ to $4f_0$.

When the single-pole double-throw switch is thrown to a solid line, the x2 doubler1 in the first-stage circuit is turned on, and an signal passes through the two stages of frequency multipliers to be frequency quadrupled, thereby implementing frequency quadrupling of the input signal from $f_0$ to $4f_0$. Meanwhile, the phase shifter on the other path and the two disconnected switches jointly generate a smaller signal which is reversely superposed with the output signal of the first-stage frequency multiplier, so as to achieve an effect of suppressing harmonics and thus improve the harmonic suppression ratio of the whole quadrupled frequency. In the design of the frequency multiplier, even harmonic components can be easily suppressed through a differential circuit, but fundamental harmonics, particularly fundamental harmonics and third harmonics which are closer to an output useful spectrum, are difficult to be suppressed. In addition, a fundamental harmonic ($f_0$) of the first-stage frequency multiplier may be mixed with a fundamental harmonic ($2f_0$), a second harmonic ($4f_0$), and the like of the second-stage frequency multiplier to generate new spectrum components. Therefore, the integral performance of the frequency multiplier can be greatly improved by improving the fundamental harmonic suppression ratio of the frequency multiplier.

When the single-pole double-throw switch is thrown to a dotted line, the phase shifter in the first stage circuit is turned on, which has little adverse effect on the spectrum of the input signal. The signal is cascaded through the phase shifter and the x2 doubler2 to be frequency doubled, and the gain brought by the phase shifter can also improve the gain, flatness, harmonic suppression and the like of the frequency doubling.

The principle will be further explained in conjunction with FIG. 4.

A clean sinusoidal signal $A\cos(\omega_0 t)$, where $\omega_0=2\pi f_0$, is input at an input end of the system. The case where both single-pole double-throw switches are at solid lines, i.e., the first-stage frequency multiplier is on, is considered.

Neglecting the loss introduced by turning on the switches, the signal at node 2 is A cos($\omega_0$t), and after passing through the first-stage frequency multiplier, the signal at node 3 is:

$$a_1 \cos(\omega_0 t) + a_2 \cos(2\omega_0 t) + a_3 \cos(3\omega_0 t) + a_4 \cos(4\omega_0 t) + \ldots$$

where $a_2$ is an amplitude of the output signal, the fundamental harmonic amplitude is $a_1$, the third harmonic amplitude is $a_3$, and the fourth harmonic amplitude is $a_4$. In the actual process, $a_2$ is relatively close to 1, and $a_1$, $a_3$ and $a_4$ are relatively close to zero. That is, the optimal output result is a 2 cos($2\omega_0$t), but there may be other signal interference. The phase shifter can reduce the interference.

Since both single-pole double-throw switches are turned on on the path of the frequency multiplier, the switches are off on the path of the phase shifter. Each switch has a degree of isolation IL from the input port to the broken port, which causes a signal amplitude at node 4 to decay IL, and likewise, the signal amplitude will decay IL again after passing through the second switch. Assuming that a gain of the phase shifter is 1, then the signal at node 5 is $b_1 \cos(\omega_0 t)$.

The phase shifter in FIG. 4 is phase-adjustable, so as to ensure that phases at node 5 and node 3 are opposite at $f_0$. Then the signal at node 6 is:

$$|a_1 - b_1| \cos(\omega_0 t) + a_2 \cos(2\omega_0 t) + a_3 \cos(3\omega_0 t) + a_4 \cos(4\omega_0 t) + \ldots$$

As a result, the fundamental harmonic suppression of the first-stage frequency multiplier from nodes 1 to 6 is significantly improved, and for a frequency quadrupler, a spectrum of the input signal becomes "clean", and harmonic suppression of the output signal is also improved.

Considering a second scenario in which the two single-pole double-throw switches are both at dotted lines, that is, the branch where the first-stage frequency multiplier is located is not turned on, when a signal is cascaded to the second-stage frequency multiplier through the phase shifter, the loss caused by the switches is still ignored, and it is assumed that the gain of the phase shifter is 1. Then the signal at node 6 is: A cos($\omega_0$t+$\varphi_0$). Compared with the traditional frequency multiplier architecture, the signal amplitude at this node is slightly larger, which also increases an output power of the output signal after being cascaded to the second-stage frequency multiplier.

Considering that the chip area occupied by the phase shifter cannot be saved when the whole system is cascaded, introduction of the phase shifter will not bring any extra area.

For example, the doubler1 is designed to be a frequency doubler with an input frequency ranging from 3.5 GHz to 6.5 GHz, and the doubler2 is a frequency doubler with an input frequency ranging from 7 GHz to 13 GHz. When the system is operated in a frequency quadrupling mode, the two stages of frequency multipliers are cascaded, the input frequency is 3.5 GHz to 6.5 GHz, and the output frequency is 14 GHz to 26 GHz. When the system is operated in a frequency doubling mode, the phase shifter and the second-stage frequency multiplier are cascaded, the input frequency is 7 GHZ to 13 GHz, and the output frequency is 14 GHz to 26 GHz.

Figure 5:
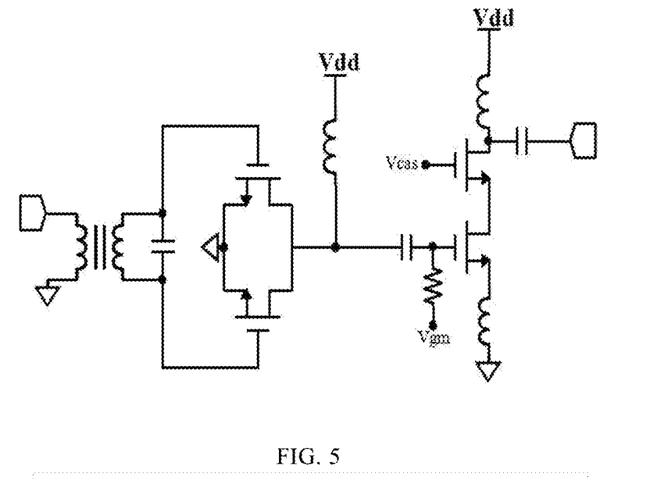
FIG. 5 is a circuit configuration diagram illustrating a frequency multiplier used in a method for outputting a frequency multiplication signal according to an embodiment of the present disclosure.

A balanced frequency multiplier architecture is taken to illustrate benefits of the frequency multiplier architecture adopted in the present disclosure, and a circuit configuration diagram of the frequency multiplier is shown in FIG. 5, which includes a stage of balanced frequency multiplier and a stage of buffer. Vcas is a gate voltage of a cascode transistor, Vgm is a gate voltage of a common-source transistor, and Vdd is an operating voltage of the circuit.

Figure 6:
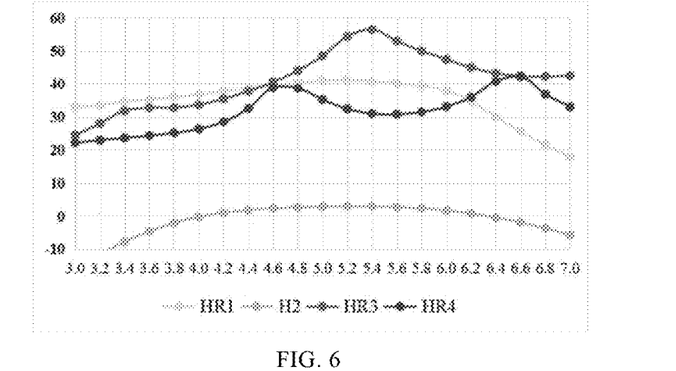
FIG. 6 is a schematic diagram illustrating a conversion gain and a harmonic suppression ratio of conventional balanced frequency doubling.
Figure 7:
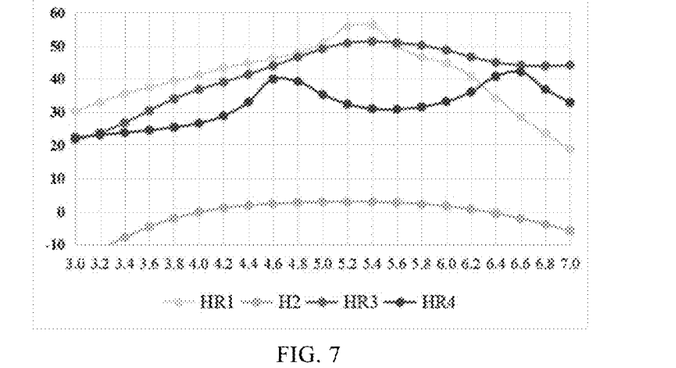
FIG. 7 is a schematic diagram illustrating a conversion gain and a harmonic suppression ratio of a first frequency doubler used in a method for outputting a frequency multiplication signal according to an embodiment of the disclosure.

A conversion gain and a harmonic suppression ratio of the first-stage frequency doubler are shown in FIG. 6. H2 is a second harmonic power, i.e., the desired frequency doubled signal, HR1 is a fundamental harmonic suppression ratio, HR3 is a third harmonic suppression ratio, and HR4 is a fourth harmonic suppression ratio. In the concerned frequency band, the conversion gain of the frequency multiplier is −1 dB to 3 dB; and the fundamental harmonic suppression ratio HR1 of the frequency multiplier is over 26 dBc, the third harmonic suppression ratio HR3 is over 32 dBc, and the fourth harmonic suppression ratio HR4 is over 28 dBc. After the phase shifter unit is added to the parallel branch of the first-stage frequency multiplier, phase changes of the phase shifter are subjected to parameter scanning optimization. When a phase change of the phase shifter causes a phase difference of approximately 180° between the two branches, the harmonic suppression ratio of the frequency multiplier is notably improved, and the conversion gain and the harmonic suppression ratio of the frequency multiplier are as shown in FIG. 7. In the concerned frequency band, the conversion gain of the frequency multiplier is −1 dB to 3 dB; and the fundamental harmonic suppression ratio HR1 of the frequency multiplier is over 31 dBc, the third harmonic suppression ratio HR3 is over 38 dBc, and the fourth harmonic suppression ratio HR4 is over 28 dBc. Apparently, the conversion gain of the improved frequency multiplier is hardly changed, but the harmonic suppression ratio is greatly improved, especially the fundamental harmonic suppression ratio.

Figure 8:
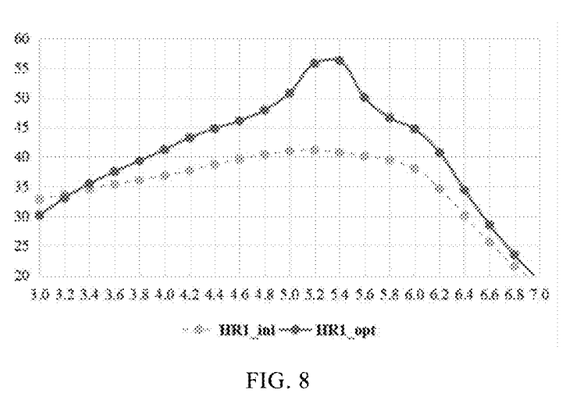
FIG. 8 is a comparison diagram illustrating fundamental harmonic suppression ratios in a method for outputting a frequency multiplication signal according to an embodiment of the present disclosure.

For convenience of comparison, the fundamental harmonics of the two are put together, as shown in FIG. 8. In the concerned frequency band, the fundamental harmonic suppression ratio is improved by at least 5 dB, and even by 15 dB around a center frequency of 5.5 GHz.

The frequency quadrupled harmonic suppression ratio obtained by cascading the two stages of frequency multipliers are influenced by the harmonic suppression ratios of the two stages of frequency multipliers, respectively. Therefore, the improvement in harmonic suppression of the first-stage frequency multiplier further indirectly improves the harmonic suppression ratio of the frequency quadrupler.

In the frequency multiplier system multiplexing frequency doubling and frequency quadrupling, even if a phase shifting unit such as the phase shifter is not introduced into the parallel branch of the first-stage frequency multiplier, microstrip lines or coplanar waveguides are also desired to realize connectivity of the first-stage frequency multiplier. Therefore, no extra area is occupied by introducing the phase shifter.

The present disclosure aims to achieve the effect of reducing fundamental harmonic suppression by means of vector synthesis of signals in a concerned frequency band through interaction of two circuit configurations, which is a significant innovation in the frequency multiplier circuit. The present disclosure is not only suitable for a system multiplexing frequency doubling and frequency quadrupling, but also suitable for a single frequency doubling circuit, and can improve the harmonic suppression ratio of the frequency doubling circuit in a parallel branch mode. For the specific implementation, reference may be made to the first-stage circuit.

Through the description of the above implementations, it should be clearly understood by those skilled in the art that the method according to the above embodiment may be implemented by means of software and essential universal hardware platform. Obviously, it may also be implemented by hardware, but in most cases, the former is preferable. Based on such understanding, the essence of the technical solutions of the present disclosure, or the contribution of the technical solutions of the embodiments of the present disclosure over the existing art, can be embodied in the form of a software product, and the software product is stored in a storage medium (such as an ROM/RAM, a disk, or an optical disc) including a number of instructions such that a terminal device (which may be a mobile phone, a computer, a server, or a network device, etc.) performs the methods described in the various embodiments of the present disclosure.

In an embodiment, there is further provided a device for outputting a frequency multiplication signal, which is configured to implement the above embodiment and preferable implementations. Details which have been explained will not be repeated here. As used herein, the term "module" may be a combination of software and/or hardware that can realize a preset function. The devices described in the following embodiments are preferably implemented in software, but hardware, or a combination of software and hardware, is also possible and contemplated.

Figure 9:
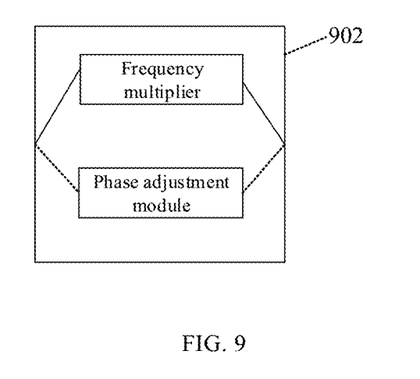
FIG. 9 is a schematic diagram illustrating a target circuit in a device for outputting a frequency multiplication signal according to an embodiment of the present disclosure.

Optionally, as shown in FIG. 9, the device includes a target circuit 902. The target circuit includes a parallel circuit, a first circuit of the parallel circuit is provided with a frequency multiplier, a second circuit of the parallel circuit is provided with a phase adjustment module, the first circuit is connected to an input end and an output end of the target circuit, the second circuit is disconnected from the input end and the output end, the phase adjustment module is configured to adjust a phase of the second circuit to a target phase, a phase difference between the target phase and a first phase of the first circuit is greater than 90 degrees, and the target circuit is configured to multiply an input initial signal to a frequency multiplication signal of the initial signal.

Other examples of the present embodiment may refer to the above example, and are not described in detail here.

An embodiment of the present disclosure further provides a computer-readable storage medium having a computer program stored thereon, where the computer program is configured to, when executed, cause operations of any one of the above method embodiments to be implemented.

In an exemplary embodiment, the computer-readable storage medium may include, but is not limited to: a U disk, a read-only memory (ROM), a random access memory (RAM), a mobile hard disk, a disk or optical disk, or any other medium that can store a computer program.

An embodiment of the present disclosure further provides an electronic apparatus, including a memory and a processor, where the memory has a computer program stored thereon, and the processor is configured to execute the computer program to perform operations of any one of the method embodiments described above.

In an exemplary embodiment, the electronic apparatus may further include a transmission device and an input/output device. The transmission device is connected to the processor, and the input/output device is connected to the processor.

Specific examples in the present embodiment may refer to the examples described in the foregoing embodiments and exemplary implementations, which will not be repeated in the present embodiment.

Obviously, a person skilled in the art will understand that the above modules and operations of the present disclosure may be implemented by a universal computing device, may be integrated in a single computing device or distributed over a network that consists of a plurality of computing devices. They can be realized using the executable program code of the computing device so that they can be stored in a storage device and executed by the computing device, in some cases, can perform the shown or described operations in a sequence other than herein, or they are made into different integrated circuit modules respectively, or a plurality of modules or operations thereof are made into a single integrated circuit module, thus to be realized. In this way, the present disclosure is not limited to any specific hardware and software combination.

The descriptions above are merely preferred embodiments of the present disclosure, which are not used to limit the present disclosure. For those skilled in the art, the present disclosure may have various changes and variations. Any modification, equivalent replacement, improvement and the like made within the principle of the present disclosure should be included in the protection scope of the present disclosure.

What is claimed is:

1. A method for outputting a frequency multiplication signal with high harmonic suppression, comprising:
   obtaining an initial signal;
   inputting the initial signal into a target circuit, wherein the target circuit includes a parallel circuit, a first circuit of the parallel circuit is provided with a frequency multiplier, a second circuit of the parallel circuit is provided with a phase adjustment module, the first circuit is connected to an input end and an output end of the target circuit, the second circuit is disconnected from the input end and the output end, and the phase adjustment module is configured to adjust a phase of the second circuit to a target phase, wherein a phase difference between the target phase and a first phase of the first circuit is more than 90 degrees; and
   taking a target signal output from the target circuit as a frequency multiplication signal of the initial signal;
   wherein the phase adjustment module is further configured to set a harmonic amplitude of the second circuit to have a difference less than a first threshold from a harmonic amplitude of the first circuit.

2. The method according to claim 1, wherein the phase difference between the target phase and the first phase is 180 degrees.

3. The method according to claim 1, wherein the phase adjustment module is a phase shifter or an inverter or an amplifier.

4. The method according to claim 1, wherein the first circuit is connected to the input end and the output end through a single-pole double-throw switch.

5. The method according to claim 1, wherein the frequency multiplier is a first frequency doubler, a second frequency doubler is connected after the output end, and taking the target signal output from the target circuit as the frequency multiplication signal of the initial signal comprises:
   under the condition that the first circuit is connected to the input end and the output end of the target circuit while the second circuit is disconnected from the input end and the output end, processing the initial signal through the first frequency doubler and the second frequency doubler to output a frequency-quadrupled signal; and
   under the condition that the first circuit is disconnected from the input end and the output end of the target circuit while the second circuit is connected to the input end and the output end, processing the initial signal through the phase adjustment module and the second frequency doubler to output a frequency-doubled signal.

6. A device for outputting a frequency multiplication signal with high harmonic suppression, comprising:
   a target circuit comprising a parallel circuit, wherein a first circuit of the parallel circuit is provided with a frequency multiplier, a second circuit of the parallel circuit is provided with a phase adjustment module, the first circuit is connected to an input end and an output end of the target circuit, the second circuit is disconnected from the input end and the output end, and the phase adjustment module is configured to adjust a phase of the second circuit to a target phase, wherein a phase difference between the target phase and a first phase of the first circuit is more than 90 degrees, and
   the target circuit is configured to multiply an input initial signal to a frequency multiplication signal of the initial signal;
   wherein the phase adjustment module is further configured to set a harmonic amplitude of the second circuit to have a difference less than a first threshold from a harmonic amplitude of the first circuit.

7. The device according to claim 6, wherein the frequency multiplier on the first circuit is a first frequency doubler, and the device further comprises:
   a second frequency doubler connected to the parallel circuit in series, wherein
   under the condition that the first circuit is connected to the input end and the output end of the target circuit while the second circuit is disconnected from the input end and the output end, the initial signal is processed through the first frequency doubler and the second frequency doubler to output a frequency-quadrupled signal; and
   under the condition that the first circuit is disconnected from the input end and the output end of the target circuit while the second circuit is connected to the input end and the output end, the initial signal is processed through the phase adjustment module and the second frequency doubler to output a frequency-doubled signal.

8. A computer-readable storage medium having a computer program stored thereon, wherein the computer program, when executed by a processor, causes operations of the method according to claim 1 to be implemented.

9. An electronic apparatus, comprising a memory, a processor, and a computer program stored in the memory and executable on the processor, wherein the processor, when executing the computer program, implements operations of the method according to claim 1.

10. The device according to claim 6, wherein the phase difference between the target phase and the first phase is 180 degrees.

11. The device according to claim 6, wherein the phase adjustment module is a phase shifter or an inverter or an amplifier.

12. The device according to claim 6, wherein the first circuit is connected to the input end and the output end through a single-pole double-throw switch.

* * * * *